United States Patent
Koga

(10) Patent No.: US 9,960,479 B2
(45) Date of Patent: May 1, 2018

(54) ANTENNA DEVICE AND ELECTRONIC DEVICE

(71) Applicant: FUJITSU LIMITED, Kawasaki-shi, Kanagawa (JP)

(72) Inventor: Yohei Koga, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days. days.

(21) Appl. No.: 15/702,295

(22) Filed: Sep. 12, 2017

(65) Prior Publication Data

US 2018/0097277 A1    Apr. 5, 2018

(30) Foreign Application Priority Data

Oct. 3, 2016 (JP) ................................. 2016-195947

(51) Int. Cl.

| | |
|---|---|
| *H01Q 1/52* | (2006.01) |
| *H01Q 1/24* | (2006.01) |
| *H01Q 1/38* | (2006.01) |
| *H01Q 5/357* | (2015.01) |
| *H01Q 1/22* | (2006.01) |
| *H01Q 9/04* | (2006.01) |
| *H01Q 9/42* | (2006.01) |

(52) U.S. Cl.
CPC ........... *H01Q 1/243* (2013.01); *H01Q 1/2283* (2013.01); *H01Q 1/38* (2013.01); *H01Q 1/523* (2013.01); *H01Q 5/357* (2015.01); *H01Q 9/0407* (2013.01); *H01Q 9/42* (2013.01); *H01L 2223/6677* (2013.01)

(58) Field of Classification Search
None
See application file for complete search history.

(56) References Cited

U.S. PATENT DOCUMENTS

| | | | |
|---|---|---|---|
| 2002/0145569 A1 | 10/2002 | Onaka et al. | |
| 2003/0193438 A1 | 10/2003 | Yoon | |
| 2004/0066341 A1* | 4/2004 | Ito .......................... | H01Q 1/243 |
| | | | 343/702 |
| 2004/0130493 A1* | 7/2004 | Horita ...................... | H01Q 1/08 |
| | | | 343/702 |
| 2007/0139270 A1 | 6/2007 | Takei et al. | |

(Continued)

FOREIGN PATENT DOCUMENTS

| | | |
|---|---|---|
| JP | 2002-314330 | 10/2002 |
| JP | 2003-318640 | 11/2003 |

(Continued)

*Primary Examiner* — David Bilodeau
(74) *Attorney, Agent, or Firm* — Fujitsu Patent Center

(57) ABSTRACT

An antenna device includes a ground plane configured to have an end side; a ground element configured to have a first end and a second end; a first radiation element configured to have a first line extending upright with respect to the ground element from a grounded end, a second line coupled to the first line, and a feed point; a second radiation element configured to have a third line, and a fourth line coupled to the third line; a first parasitic element configured to have a first parasitic line, and a second parasitic line coupled to the first parasitic line and extending along the ground element toward the first end; and a second parasitic element configured to have a fifth line located close to a tip of the second parasitic line, and a sixth line extending along the ground element from a tip of the fifth line.

10 Claims, 9 Drawing Sheets

(56) References Cited

U.S. PATENT DOCUMENTS

| | | | | |
|---|---|---|---|---|
| 2012/0200461 A1* | 8/2012 | Lee | ............... | H01Q 9/42 |
| | | | | 343/700 MS |
| 2016/0020527 A1* | 1/2016 | Koga | ............... | H01Q 9/16 |
| | | | | 343/727 |
| 2017/0033453 A1* | 2/2017 | Koga | ............... | H01Q 1/243 |
| 2017/0294706 A1* | 10/2017 | Koga | ............... | H01Q 1/24 |

FOREIGN PATENT DOCUMENTS

| JP | 2007-300398 | 11/2007 |
|---|---|---|
| JP | 2013-021716 | 1/2013 |

\* cited by examiner

ANTENNA DEVICE AND ELECTRONIC DEVICE

CROSS-REFERENCE TO RELATED APPLICATION

This application is based upon and claims the benefit of priority of the prior Japanese Patent Application No. 2016-195947, filed on Oct. 3, 2016, the entire contents of which are incorporated herein by reference.

FIELD

The embodiment discussed herein is related to an antenna device and an electronic device.

BACKGROUND

Traditionally, there has been a multiband built-in antenna including a power feeding unit composed of a feeding pin coupled to an external circuit and a feeding line having a predetermined length and including an end coupled to the feeding pin, and a radiating patch separated by a predetermined gap from the power feeding unit via a space, coupled to a portion of the power feeding unit, and configured to induce a current supplied from the power feeding unit. The multiband built-in antenna further includes a short-circuit unit having an end coupled to the radiating patch and another end grounded (refer to, for example, Japanese Laid-open Patent Publication No. 2003-318640).

Other examples of related art are Japanese Laid-open Patent Publication Nos. 2002-314330, 2013-021716, and 2007-300398.

SUMMARY

According to an aspect of the invention, an antenna device includes a ground plane configured to have an end side; a ground element configured to have a first end and a second end coupled to the ground plane and extend along the end side so that a slit having an open end on the side of the first end is formed between the ground element and the ground plane in planar view; a first radiation element configured to have a first line extending upright with respect to the ground element from a grounded end located close to the first end and coupled to the ground element, a second line coupled to the first line and extend along the ground element toward the second end to an end portion opposite to the grounded end, and a feed point located at the end portion of the second line; a second radiation element configured to have a third line coupled to the end portion of the first radiation element and extend along the ground element toward the second end, and a fourth line coupled to the third line and extending toward a direction where the fourth line is separated from the ground plane; a first parasitic element configured to have a first parasitic line extending from the second end toward a direction where the first parasitic line is separated from the ground plane in planar view, and a second parasitic line coupled to the first parasitic line and extending along the ground element toward the first end; and a second parasitic element configured to have a fifth line located close to a tip of the second parasitic line and extending from a portion between the first end and the second end toward a direction where the fifth line is separated from the ground plane, and a sixth line extending along the ground element from a tip of the fifth line toward the first end, wherein a length from the feed point through the first radiation element, the grounded end, the second end, and the end side to the open end of the slit is equal to a half of a wavelength corresponding to a first communication frequency, wherein the total length of the fifth line and the sixth line is equal to one fourth of a wavelength corresponding to a second communication frequency, wherein the total of a length from an end portion of the fourth line of the second radiation element to the feed point and a length from a ground potential point located on the ground element and corresponding to the feed point to an end portion of the second parasitic line of the first parasitic element is equal to a half of a wavelength corresponding to a third communication frequency higher than the first communication frequency, and wherein the total length of the third and fourth lines of the second radiation element is equal to one fourth of a wavelength corresponding to a fourth communication frequency higher than the third communication frequency.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Since the conventional multiband built-in antenna has the feeding line and the radiating unit that are formed almost entirely on a surface of the multiband built-in antenna, it is difficult for the conventional multiband built-in antenna to support a large number of bands.

For example, an antenna used in a mobile electronic device such as a tablet computer, a smartphone terminal, or a mobile phone terminal is limited in terms of an arrangement space or the like, the arrangement of a radiating unit is limited, and it is not easy to increase the number of bands in which communication is possible.

Thus, the present disclosure aims to provide an antenna device and an electronic device that are suitable for multiband communication.

Hereinafter, an embodiment to which an antenna device disclosed herein and an electronic device disclosed herein are applied is described.

Embodiment

Figure 1:
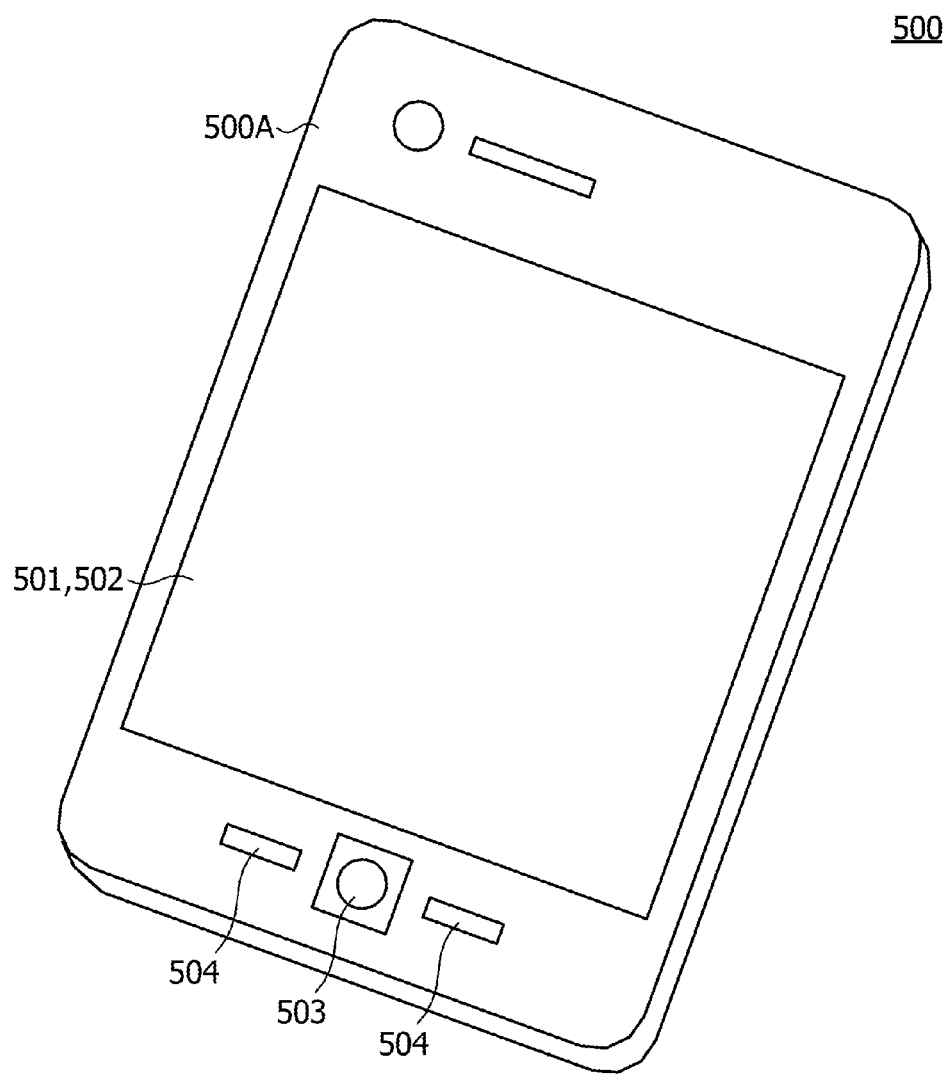
FIG. 1 is a perspective view of a front surface of a tablet computer including an antenna device according to an embodiment.

FIG. 1 is a perspective view of a front surface of a tablet computer 500 including an antenna device according to the embodiment. The tablet computer 500 is an example of an electronic device including the antenna device according to the embodiment.

A touch panel 501 and a display panel 502 are attached to an enclosure 500A of the tablet computer 500 on the side of the front surface of the tablet computer 500, while a home button 503 and switches 504 are provided on the lower side of the touch panel 501. The touch panel 501 is located on the side of a front surface of the display panel 502.

The electronic device including the antenna device according to the embodiment is not limited to the tablet computer 500 and may be a smartphone terminal, a mobile phone terminal, a game machine, or the like.

Figure 2:
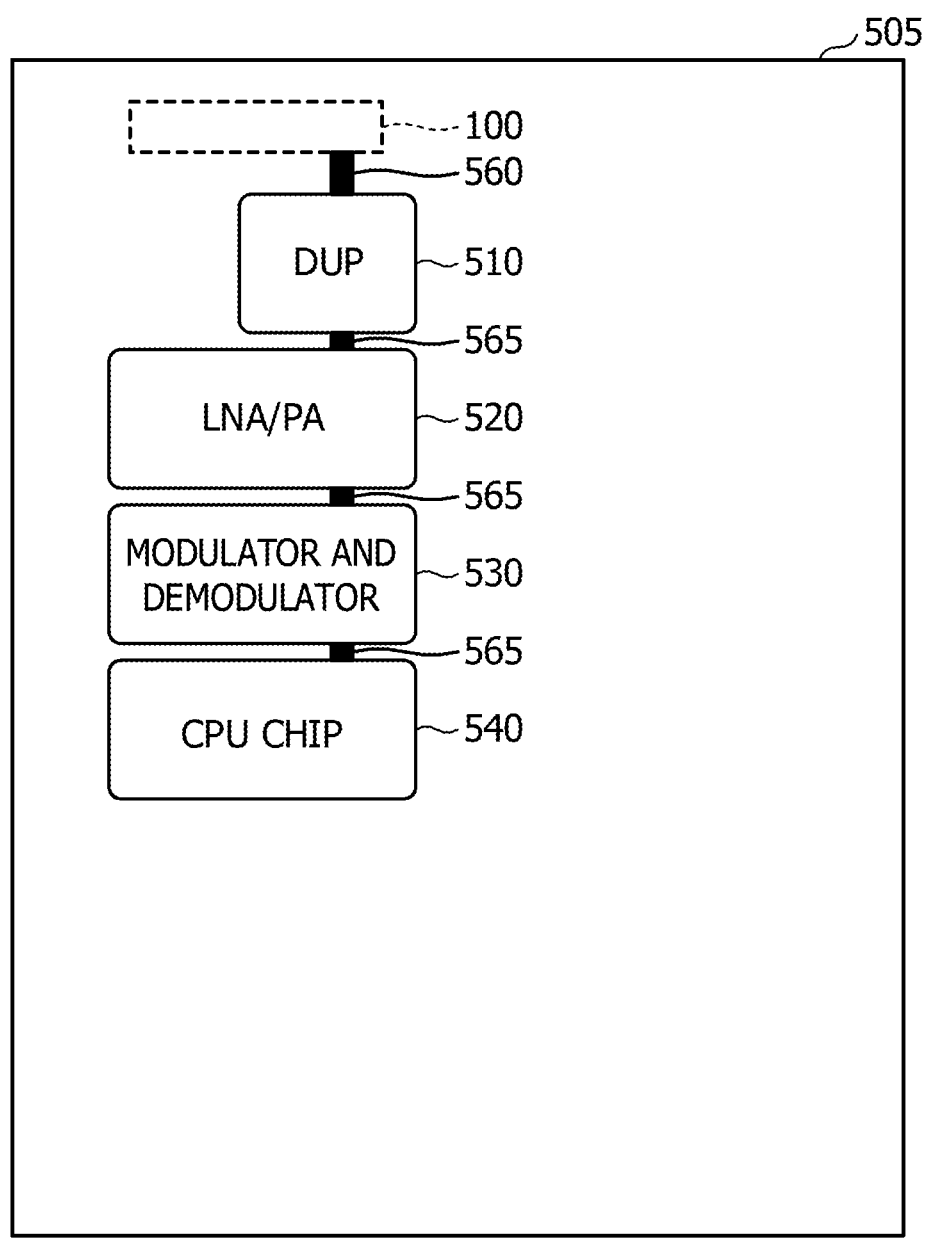
FIG. 2 is a diagram illustrating a wiring board of the tablet computer.

FIG. 2 is a diagram illustrating a wiring board 505 of the tablet computer 500.

The wiring board 505 is mounted in the enclosure 500A (refer to FIG. 1). On a surface of the wiring board 505, a duplexer (DUP) 510, a low noise amplifier (LNA) and power amplifier (PA) 520 (hereinafter referred to as LNA/PA 520), a modulator and demodulator 530, and a central processing unit (CPU) chip 540 are implemented.

On another surface of the wiring board 505 that is opposite to the surface on which the DUP 510, the LNA/PA 520, the modulator and demodulator 530, and the CPU chip 540 are implemented, the antenna device 100 according to the embodiment is mounted. A detailed configuration of the antenna device 100 is described later. In FIG. 2, the position of the antenna device 100 is indicated by a broken line.

The DUP 510, the LNA/PA 520, the modulator and demodulator 530, and the CPU chip 540 are connected to each other via a wiring 565.

The DUP 510 is connected to the antenna device 100 via a wiring 560 and a via (not illustrated) and switches between transmission and reception. The DUP 510 has a function as a filter. Thus, when the antenna device 100 receives multiple frequency signals, the DUP 510 may separate the frequency signals in the DUP 510.

The LNA/PA 520 amplifies the power of a wave to be transmitted and the power of a received wave. The modulator and demodulator 530 modulates the wave to be transmitted and demodulates the received wave. The CPU chip 540 has a function as a communication processor for executing a communication process of the tablet computer 500 and a function as an application processor for executing an application program. The CPU chip 540 has an internal memory for storing data to be transmitted, received data, or the like.

The wirings 560 and 565 are formed by patterning copper foil of the surface of the wiring board 505. A matching circuit for adjusting impedance characteristics is mounted between the antenna device 100 and the DUP 510, although not illustrated in FIG. 2.

Figure 3:
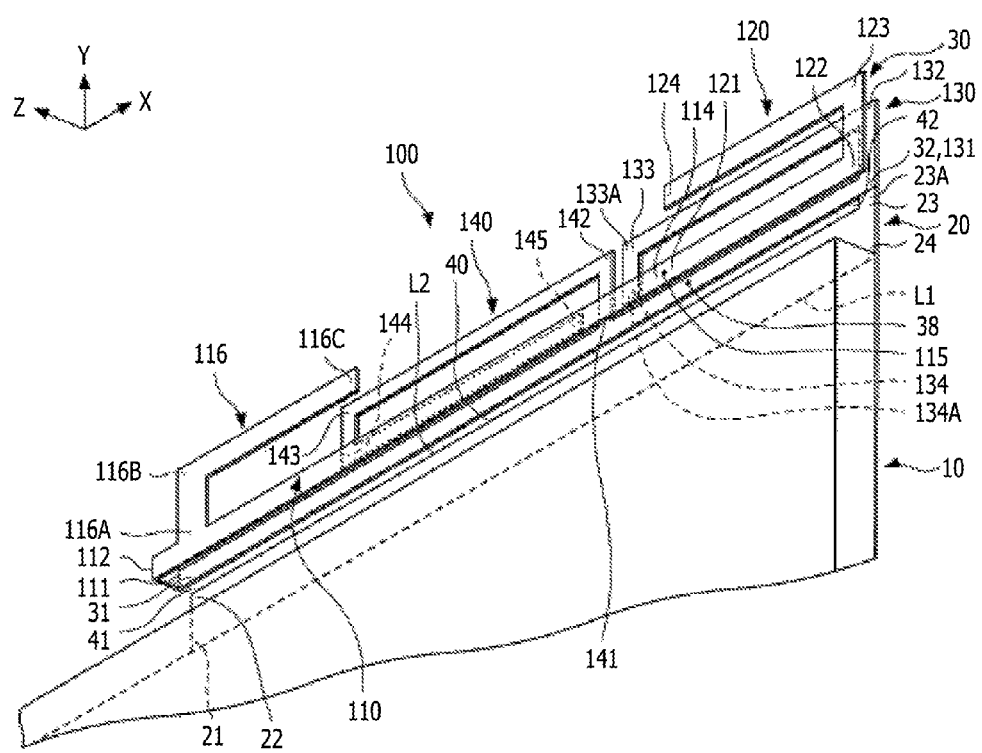
FIG. 3 is a perspective view of the antenna device according to the embodiment.
Figure 4:
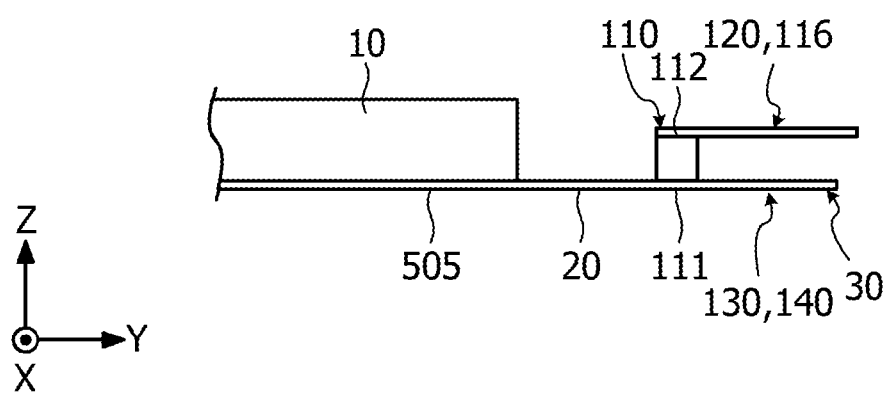
FIG. 4 is a side view of the antenna device according to the embodiment.

FIG. 3 is a perspective view of the antenna device 100 according to the embodiment. FIG. 4 is a side view of the antenna device 100 according to the embodiment. The antenna device 100 is located close to the switches 504 of the tablet computer 500 (refer to FIG. 1).

Figure 5:
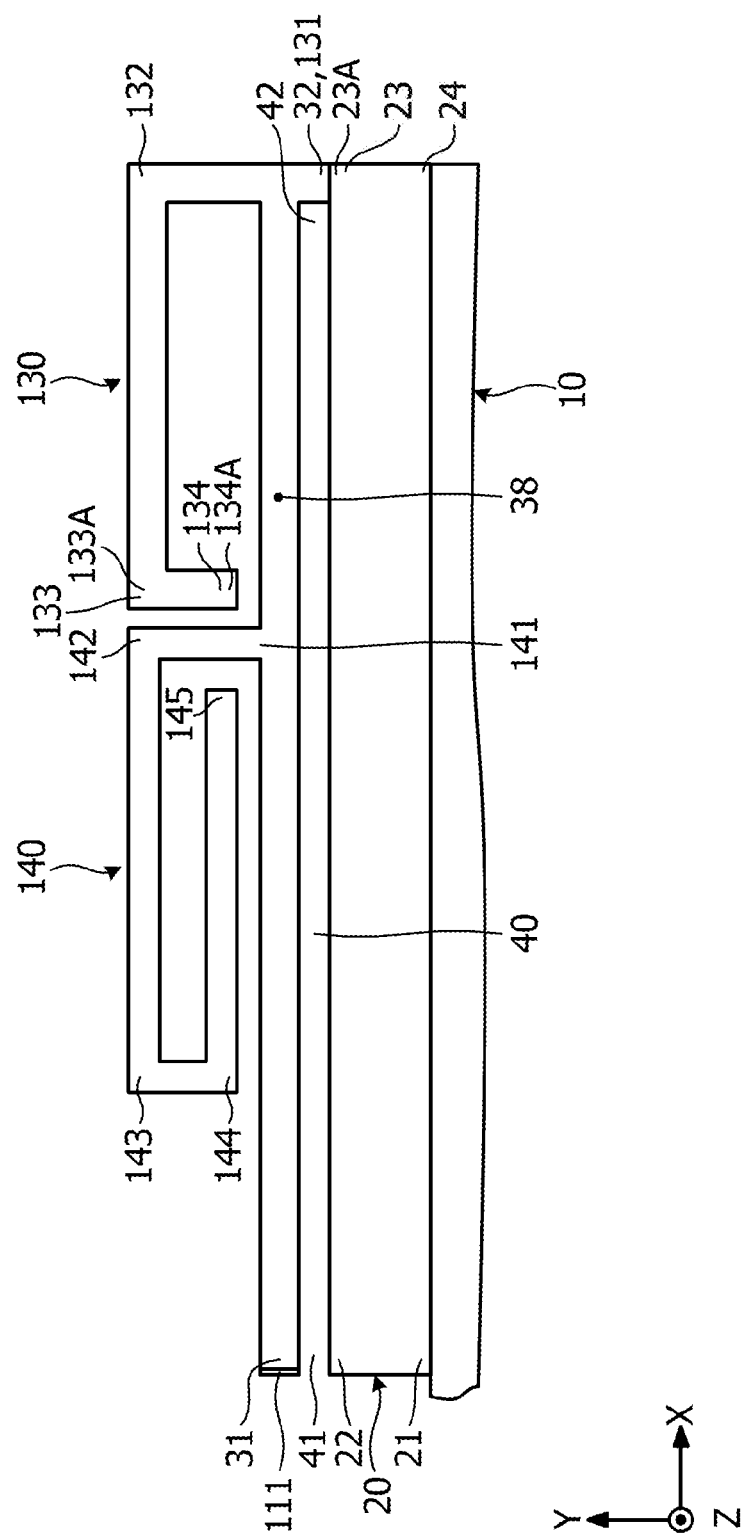
FIG. 5 is a diagram illustrating a ground plane, a ground element, and parasitic elements.
Figure 6:
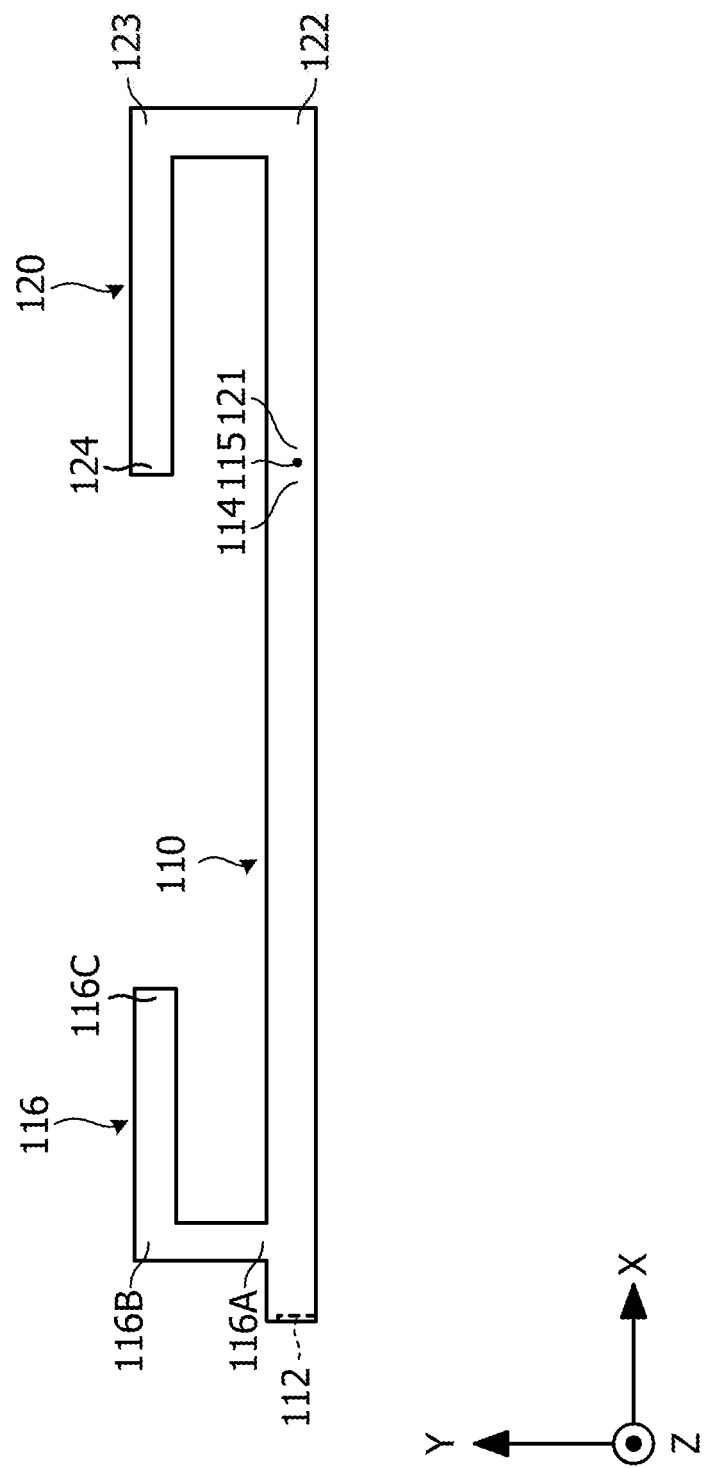
FIG. 6 is a diagram illustrating radiation elements.

The antenna device 100 includes a ground plane 20, a ground element 30, a radiation element 110, a radiation element 120, a parasitic element 130, and a parasitic element 140. The antenna device 100 is described below using an XYZ coordinate system that is an orthogonal coordinate system. In addition, the antenna device 100 is described with reference to FIGS. 3 and 4 and FIGS. 5 and 6. FIG. 5 is a diagram illustrating the ground plane 20, the ground element 30, the parasitic element 130, and the parasitic element 140. FIG. 6 is a diagram illustrating the radiation element 110 and the radiation element 120.

The antenna device 100 is attached to a metal sheet 10 included in the enclosure 500A of the tablet computer 500 (refer to FIG. 2) as an example.

The metal sheet 10 has a larger thickness than those of the ground plane 20 and the ground element 30 and is maintained at a ground potential. The metal sheet 10 is, for example, sheet metal mounted on the opposite side to a display surface of the display panel 502 (refer to FIG. 1). In this case, the metal sheet 10 is provided to reinforce the display panel 502. The metal sheet 10 is located on the back side of the wiring board 505 illustrated in FIG. 2.

Any or a combination of the CPU chip, the memory, and the other electronic components that are used to achieve functions of the electronic device may be coupled to the metal sheet 10. The metal sheet 10 is not limited to the aforementioned sheet, as long as the metal sheet 10 is included in the aforementioned electronic device. The electronic device may not include the display panel.

The ground plane 20 is a metal layer coupled to a side L1, extending in parallel to the X axis, of the metal sheet 10. The ground plane 20 is maintained at the ground potential. The ground plane 20 is the metal layer formed in a rectangular shape and has corners 21, 22, 23, and 24.

The side L1 connecting the corners 21 and 24 to each other and a side L2 connecting the corners 22 and 23 to each other extend in parallel to the X axis. A side connecting the corners 21 and 22 to each other and a side connecting the corners 23 and 24 to each other extend in parallel to the Y axis. The side L2 is opposite to the side L1 and is an end side of the ground plane 20. In addition, the ground plane 20 has a coupling portion 23A extending from the corner 23 toward the positive direction on the Y axis and coupled to an end portion 32 of the ground element 30.

The ground plane 20 functions as a ground plane of the antenna device 100. The ground plane 20 is, for example, a plated layer formed on an inner surface of the enclosure 500A. The plated layer may be made of copper plate or other metal plate, for example. In addition, the ground plane 20 may be achieved by metal foil attached to the surface of the wiring board 505.

The ground element 30 is a linear metal layer having an end portion 31 and the end portion 32 and is coupled to the parasitic elements 130 and 140 on the positive side of the Y axis. The ground element 30 is formed together with the parasitic elements 130 and 140. The ground element 30 functions as a portion of the ground plane of the antenna device 100.

The end portion 32 of the ground element 30 is coupled to the coupling portion 23A of the ground plane 20. The end portion 31 is separated from the corner 22. Thus, a slit 40 is formed between the ground element 30 and the ground plane 20.

The ground element 30 substantially overlaps the radiation element 110 and the radiation element 120 in XY planar view and is provided to take measures against a specific absorption rate (SAR).

In the case where the antenna device 100 is incorporated in the electronic device, it is sufficient if the ground element 30 is located on a human body side.

The ground element 30 is, for example, a plated layer formed on the inner surface of the enclosure 500A. The plated layer may be made of copper plate or other metal plate, for example. In addition, the ground element 30 may be achieved by metal foil attached to the surface of the wiring board 505. The ground element 30 and the ground plane 20 may be made of a single metal foil piece in a unified manner, or the ground element 30 may be made of a plated layer in a manner that is the same as or similar to the ground plane 20.

The slit 40 has an end 41 and an end 42 and extends in the X axis direction between the ground plane 20 and the ground element 30. The end 41 is an open end, while the end 42 is closed by the coupling portion 23A. The length of the slit 40 between the ends 41 and 42 of the slit 40 is described later.

Next, the radiation element 110, the radiation element 120, and the parasitic element 130 are described. The radiation elements 110 and 120 are formed on a dielectric body mounted on the positive side of the Z axis with respect to the ground element 30 or are formed on the board or the surface of the enclosure. An illustration of the dielectric body, the board, or the enclosure is omitted. As an example, the case where the antenna device 100 is included in the tablet computer 500 (refer to FIG. 1) is described below. Thus, the radiation elements 110 and 120 are formed on the dielectric body mounted on the positive side of the Z axis with respect to the ground element 30 or are formed on the board included in the tablet computer 500 or the inner surface of the enclosure 500A (refer to FIG. 1).

The radiation element 110 is provided to achieve communication at the lowest communication frequency f1 and the highest communication frequency f5 among communication frequencies of the antenna device 100. A design value of the communication frequency f1 is, for example, 0.8 GHz, while a design value of the communication frequency f5 is, for example, 2.5 GHz.

The radiation element 110 includes a grounded end 111, a folded portion 112, an end portion 114, a feed point 115, and a branch element 116. The feed point 115 is located at the end portion 114 of the radiation element 110.

The grounded end 111 is coupled to the end portion 31 of the ground element 30. The grounded end 111 is an example of a grounded end. The radiation element 110 extends upright from the grounded end 111 toward the positive direction on the Z axis and is folded at the folded portion 112 toward the positive direction on the X axis and extends to the end portion 114. The end portion 114 is coupled to an end portion 121 of the radiation element 120. The radiation element 110 is integrally formed with the radiation element 120.

The end portion 114 is an end portion, located on the positive side of the X axis, of a portion functioning as the radiation element 110 among the integrally formed radiation elements 110 and 120 and is not an physically structured end portion.

A line between the grounded end 111 and the folded portion 112 is an example of a first line. A line between the folded portion 112 and the end portion 114 is an example of a second line.

The line between the grounded end 111 and the folded portion 112 is a thin plate-shaped line extending in parallel to the YZ plane. The line between the folded portion 112 and the end portion 114 is a thin plate-shaped line extending in parallel to the XY plane.

The line between the grounded end 111 and the folded portion 112 may be a thin plate-shaped line extending in parallel to the XZ plane toward the positive direction on the Z axis from a portion, located on the negative side of the Y axis, of the end portion 31 of the ground element 30. In this case, it is sufficient if a section in which the thin plate-shaped line extending in parallel to the XZ plane is folded toward the thin plate-shaped line extending in parallel to the XY plane is provided between the line between the grounded end 111 and the folded portion 112 and the line between the folded portion 112 and the end portion 114.

The feed point 115 is located at a boundary between the end portion 114 and the end portion 121 of the radiation element 120. Thus, the end portion 114 serves as the feed point. Power is fed to the feed point 115 via a microstrip line (not illustrated), a coaxial cable (not illustrated), or the like.

A ground potential point 38 is located on the ground element 30 on the negative side of the Z axis with respect to the feed point 115 of the ground element 30. The ground potential point 38 is located immediately under the feed point 115. For example, if a core of the coaxial cable is coupled to the feed point 115, a shield of the coaxial cable is coupled to the ground potential point 38. The ground potential point 38 is at a standard potential.

The communication at the communication frequency f1 is not executed by the radiation element 110 independently, but is achieved by causing the ground plane 20 extending along the slit 40 and the ground element 30 extending along the slit 40 to collaborate with each other. This feature is described later.

The branch element 116 has an end portion 116A, a folded portion 116B, and an open end 116C. The length of the branch element 116 from the end portion 116A through the folded portion 116B to the open end 116C is set to one fourth of a wavelength $\lambda_5$ of the communication frequency f5. The branch element 116 functions as a monopole antenna.

The open end 116C is a portion at which the intensity of an electric field is highest among all the portions of the branch element 116. In order to improve radiation characteristics of the branch element 116, the open end 116C is located on the negative side of the X axis with respect to an open end 145 of the parasitic element 140 (described later).

The radiation element 120 has an end portion 121, folded portions 122 and 123, and an open end 124. The radiation element 120 is provided to achieve both communication at the second highest communication frequency f4 among the communication frequencies of the antenna device 100 and communication at the third highest communication frequency f3 among the communication frequencies of the antenna device 100. The radiation element 120 is an example of a second radiation element. A design value of the communication frequency f3 is, for example, 1.5 GHz, while a design value of the communication frequency f4 is, for example, 2.2 GHz. The height of the radiation element 120 with respect to the ground element 30 is equal to the height of the radiation element 110 with respect to the ground element 30.

The radiation element 120 extends from the end portion 121 toward the positive direction on the X axis and is folded at the folded portion 122 toward the positive direction on the Y axis and folded at the folded portion 123 toward the negative direction on the X axis and extends to the open end 124. The radiation element 120 is formed in a U shape.

The end portion 121 is coupled to the end portion 114 of the radiation element 110. The feed point 115 is located at the boundary between the end portion 121 and the end portion 114. Specifically, the end portion 121 serves as the feed point.

Since the radiation element 120 is integrally formed with the radiation element 110, the end portion 121 is an end portion, located on the negative side of the X axis, of a portion functioning as the radiation element 120 among the integrally formed radiation elements 110 and 120 and is not an physically structured end portion.

The length of the radiation element 120 from the end portion 121 (feed point 115) through the folded portions 122 and 123 to the open end 124 is set to one fourth of a wavelength $\lambda_4$ of the communication frequency f4. Thus, the radiation element 120 functions as a monopole antenna.

A line between the end portion 121 and the folded portion 122 is an example of a third line. A line between the folded portion 122 and the folded portion 123 is an example of a fourth line. A line between the folded portion 123 and the open end 124 is a section extending from the line (fourth line) between the folded portion 122 and the folded portion 123.

If the radiation element 120 does not include the section extending from the folded portion 123 to the open end 124, and the length of $\lambda_4/4$ from the end portion 121 is ensured, the radiation element 120 may not include the section extending from the folded portion 123 to the open end 124. In this case, the folded portion 123 may be an open end.

The parasitic element 130 has an end portion 131, folded portions 132 and 133, and an open end 134. The parasitic element 130 is an example of a first parasitic element. In this specification, parasitic indicates that a feed point does not exist. The end portion 131 is located at the same position as the end portion 32 of the ground element 30. The parasitic element 130 is formed in a U shape.

The parasitic element 130 is provided to achieve communication at the communication frequency f3. The parasitic element 130 collaborates with the radiation element 120 to achieve the communication at the communication frequency f3.

The parasitic element 130 extends from the end portion 131 toward the positive direction on the Y axis and is folded at the folded portion 132 toward the negative direction on the X axis and folded at the folded portion 133 toward the negative direction on the Y axis and extends to the open end 134.

The total length of the parasitic element 130 extending through the feed point 115 and the ground potential point 38, a section included in the ground element 30 and extending between the end portion 32 and the ground potential point 38, and the radiation element 120 is set to a half of the wavelength $\lambda_3$ of the communication frequency f3. Thus, the parasitic element 130, the section included in the ground element 30 and extending between the end portion 32 and the ground potential point 38, and the radiation element 120 function as a dipole antenna. The position of the feed point 115 and the position of the ground potential point 38 are offset with respect to the center of the length $\lambda_3/2$ in the dipole antenna formed by the parasitic element 130, the section included in the ground element 30 and extending between the end portion 32 and the ground potential point 38, and the radiation element 120.

An end portion 133A included in the folded portion 133 and located on the negative side of the X axis is located close to the folded portion 142 of the parasitic element 140. The Y directional position of the end portion 133A is the same as the Y directional position of the folded portion 142. In addition, an end portion 134A included in the open end 134 and located on the negative side of the X axis is located close to the end portion 141 of the parasitic element 140.

A line between the end portion 131 and the folded portion 132 is an example of a first parasitic line, while a line between the folded portion 132 and the folded portion 133 is an example of a second parasitic line. A line between the folded portion 133 and the open end 134 is an example of a third parasitic line. In addition, the line between the folded portion 133 and the open end 134 may be a line extending from the second parasitic line.

If the parasitic element 130 does not include the section extending from the folded portion 133 to the open end 134, and the parasitic element 130, the section included in the ground element 30 and extending between the end portion 32 and the ground potential point 38, and the radiation element 120 achieve the dipole antenna having a length of $\lambda_3/2$, the parasitic element 130 may not include the section extending from the folded portion 133 to the open end 134. In this case, the folded portion 133 may be an open end.

The parasitic element 130 is formed in the U shape extending along the radiation element 120 in planar view. This configuration enables the parasitic element 130 to be electromagnetically coupled to the radiation element 120 and to receive power via the radiation element 120.

Thus, the line between the end portion 131 and the folded portion 132 extends along the line between the end portion 121 and the folded portion 122 in planar view. The line between the folded portions 132 and 133 extends along the line between the folded portions 122 and 123. In addition, the line between the folded portion 133 and the open end 134 extends along the line between the folded portion 123 and the open end 124.

In order to increase a band including the communication frequency f3, the width of the section between the folded portion 133 and the open end 134 may be larger than those of the section between the end portion 131 and the folded portion 132 and the section between the folded portions 132 and 133.

The parasitic element 140 has an end portion 141, folded portions 142, 143, and 144, and an open end 145. The parasitic element 140 is an example of a second parasitic element. The end portion 141 is located between the end portions 31 and 32 of the ground element 30 on the negative side of the X axis with respect to the ground potential point 38.

The parasitic element 140 extends from the end portion 141 toward the positive direction on the Y axis and is folded at the folded portion 142 toward the negative direction on the X axis, folded at the folded portion 143 toward the negative direction on the Y axis, and folded at the folded portion 144 toward the positive direction on the X axis, and extends to the open end 145.

A line between the end portion 141 and the folded portion 142 is an example of a fifth line. A line between the folded portions 142 and 143 is an example of a sixth line. A line between the folded portions 143 and 144 is an example of a seventh line. A line between the folded portion 144 and the open end 145 is an example of an eighth line.

The line between the end portion 141 and the folded portion 142 extends along and is located close to the line between the folded portion 133 and the open end 134 so that capacitive coupling occurs in the X axis direction between the line between the end portion 141 and the folded portion 142 and the line between the folded portion 133 and the open end 134. In addition, the end portion 141 is located close to the open end 134. The open end 134 is a portion at which the intensity of an electric field is highest among all the portions of the parasitic element 130. Thus, the parasitic element 140 receives power via the parasitic element 130.

The parasitic element 140 is provided to achieve the communication at the communication frequency f2. The length of the parasitic element 140 from the end portion 141 through the folded portions 142, 143, and 144 to the open end 145 is set to one fourth of a wavelength $\lambda_2$ of the communication frequency f2. Thus, the parasitic element 140 functions as a monopole antenna.

The open end 145 of the parasitic element 140 is a portion at which the intensity of an electric field is highest among all the portions of the parasitic element 140. In order to reduce an effect on radiation characteristics of the branch element 116, the open end 145 of the parasitic element 140 is located on the positive side of the X axis with respect to the open end 116C of the branch element 116. This is due to the fact that the branch element 116 is located on the negative side of the X axis with respect to the parasitic element 140 and extends from the folded portion 116B to the open end 116C in the positive direction on the X axis.

In the antenna device 100 described above, the length of a line extending from the feed point 115 through the grounded end 111, the end portion 32 of the ground element 30, and the coupling portion 23A to the corner 23 of the ground plane 20 and extending along the side L2 from the corner 23 to the corner 22 is set to a half ($\lambda_1/2$) of the wavelength $\lambda_1$ of the communication frequency f1.

Specifically, the aforementioned line extends through the folded portion 112 between the feed point 115 and the grounded end 111. In addition, the line extends through the portion between the end portions 31 and 32 of the ground element 30 adjacent to the slit 40 between the grounded end 11 and the coupling portion 23A. Furthermore, the line extends along the side L2 from the corner 23 of the ground plane 20 adjacent to the slit 40 to the corner 22 between the coupling portion 23A and the corner 22. The length of the aforementioned line between the feed point 115 and the corner 22 is set to a half ($\lambda_1/2$) of the wavelength $\lambda_1$ of the communication frequency f1.

It has been found that, when an electromagnetic simulation is executed, resonance occurs at the communication frequency f1 in the aforementioned current line. Specifically, in the antenna device 100, the radiation element 110, the ground plane 20 extending along the slit 40, and the ground element 30 extending along the slit 40 collaborate with each other to achieve the communication at the communication frequency f1.

Thus, in the antenna device 100 according to the embodiment, the length of the line extending from the feed point 115 through the grounded end 111, the ground element 30, and the coupling portion 23A to the corner 22 is set to a half ($\lambda_1/2$) of the wavelength $\lambda_1$ of the communication frequency f1.

Figure 7:
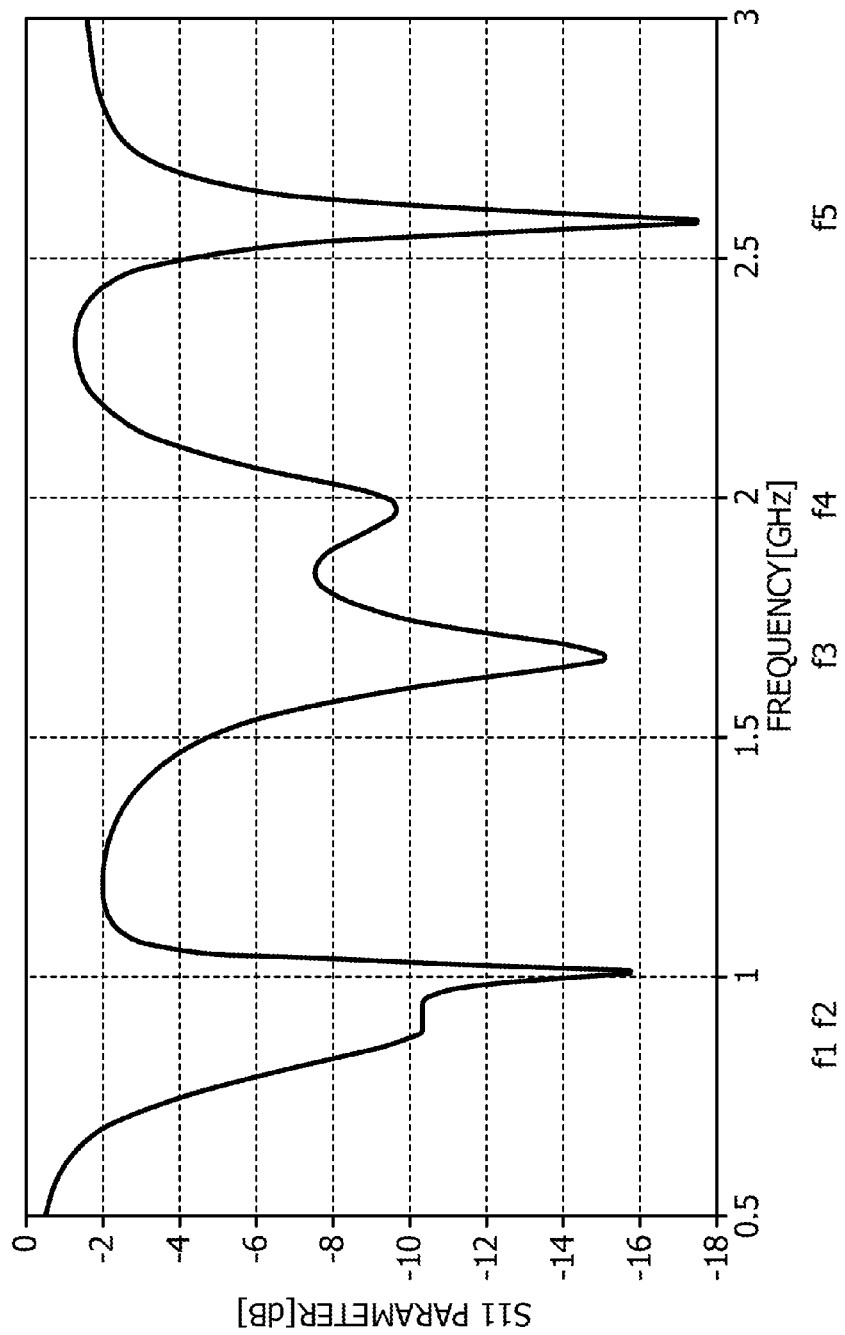
FIG. 7 is a diagram illustrating frequency characteristics of an S11 parameter of the antenna device.

FIG. 7 is a diagram illustrating frequency characteristics of an S11 parameter of the antenna device 100. The frequency characteristics of the S11 parameter were obtained by an electromagnetic simulation using a model of the antenna device 100. The electromagnetic simulation was executed without a matching circuit between the feed point 115 and the ground element 30.

As an example, evaluation is executed, while an evaluation standard for values of the S11 parameter is −6 dB, and a band corresponding to a range equal to and lower than −6 dB is a region in which communication of the antenna device 100 is possible.

As illustrated in FIG. 7, in five bands that are bands ranging from approximately 0.7 GHz to approximately 1.05 GHz (f1 and f2), bands ranging from approximately 1.55 GHz to approximately 2.05 GHz (f3 and f4), and a band ranging from approximately 2.55 GHz to approximately 2.7 GHz (f5), values equal to and lower than −6 dB were obtained.

Figure 8:
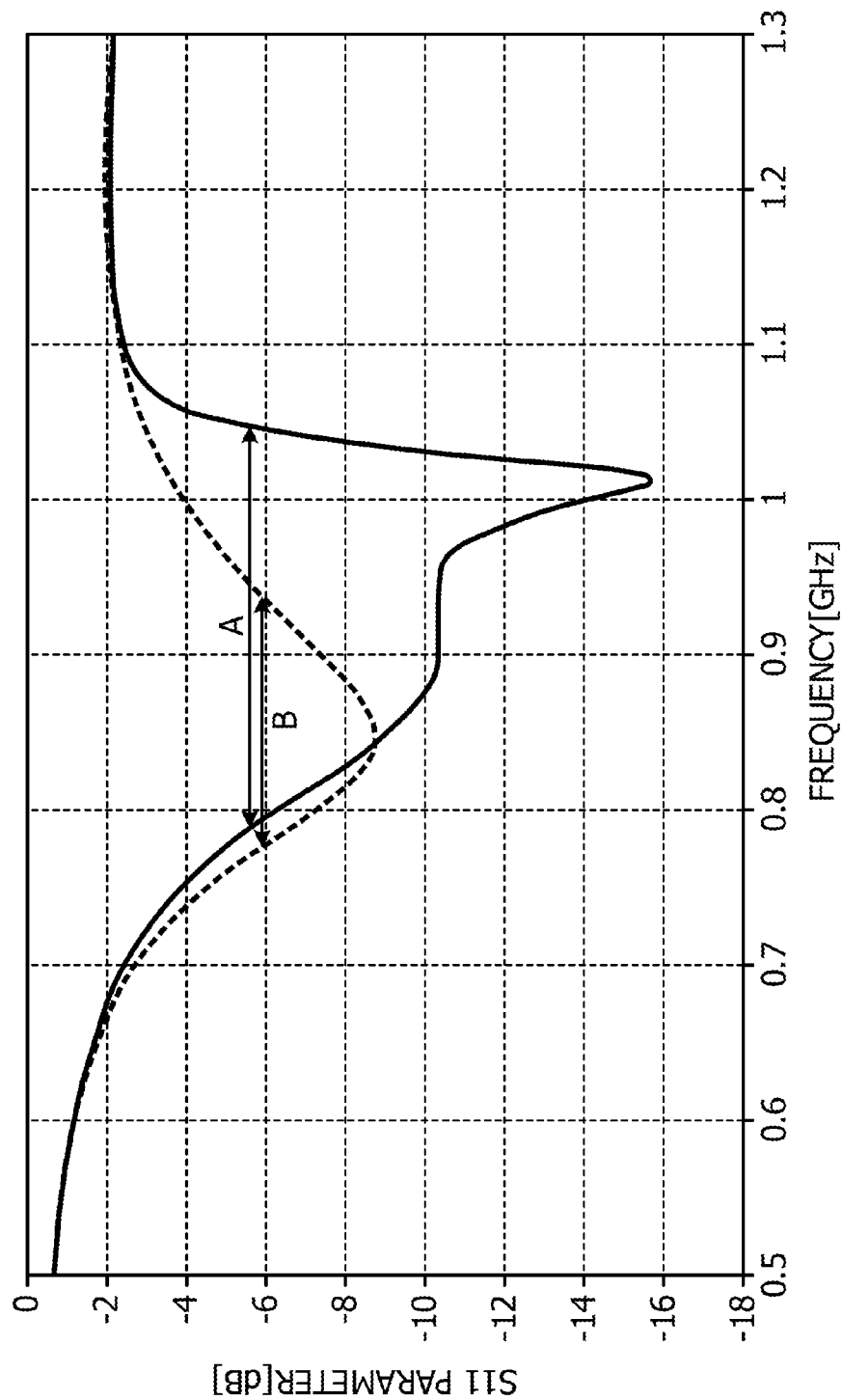
FIG. 8 is an enlarged view of characteristics that correspond to a band ranging from 0.5 GHz to 3.0 GHz and are included in the frequency characteristics, illustrated in FIG. 7, of the S11 parameter.

FIG. 8 is an enlarged view of characteristics that correspond to a band ranging from 0.5 GHz to 3.0 GHz and are included in the frequency characteristics, illustrated in FIG. 7, of the S11 parameter. In FIG. 8, a broken line indicates values of an S11 parameter of a comparative antenna device that does not include the parasitic element 140.

It has been found that, in the case where the antenna device 100 has a configuration obtained by adding the parasitic element 140 to the comparative antenna device, values of the S11 parameter that correspond to a band (corresponding to f2) ranging from approximately 0.85 GHz to approximately 1.05 GHz are improved.

A band (indicated by both ends of an arrow A) corresponding to values equal to and lower than −6 dB is approximately 250 MHz in the antenna device 100, while a band (indicated by both ends of an arrow B) corresponding to values equal to and lower than −6 dB is approximately 157 MHz in the comparative antenna device.

As described above, it has been found that, in the case where the antenna device 100 includes the parasitic element 140, the values of the S11 parameter that correspond to the band (corresponding to f2) ranging from approximately 0.85 GHz to approximately 1.05 GHz may be improved, and resonance occurs in the five bands (f1 to f5).

According to the embodiment, the antenna device 100 that enables communication to be executed in the five communication bands while not being increased in size may be provided.

According to the embodiment, the antenna device 100 that is suitable for multiband communication may be provided.

The embodiment describes the case where the length of the ground plane 20 in the X axis direction is equal to the length of the ground element 30 in the X axis direction and where the positions of both end portions of the ground plane 20 match the positions of both end portions of the ground element 30. The embodiment, however, is not limited to the aforementioned case. The length of the ground element 30 in the X axis direction may be longer than the length of the ground plane 20 in the X axis direction, while the end portion, located on the negative side of the X axis, of the ground element 30 may be located on the negative side of the X axis with respect to the end portion, located on the negative side of the X axis, of the ground plane 20. In addition, the length of the ground element 30 in the X axis direction may be longer than the length of the ground plane 20 in the X axis direction, while the end portion, located on the positive side of the X axis, of the ground element 30 may be located on the positive side of the X axis with respect to the end portion, located on the positive side of the X axis, of the ground plane 20. Furthermore, the length of the ground element 30 in the X axis direction may be longer than the length of the ground plane 20 in the X axis direction, while both end portions of the ground element 30 in the X axis direction may be located on the outer side with respect to both end portions of the ground plane 20 in the X axis direction.

The embodiment describes the case where the communication frequency f2 of the parasitic element 140 is higher than the communication frequency f1 and lower than the communication frequency f3. The communication frequency f2, however, may be lower than the communication frequency f1 and higher than the communication frequency f3. The communication frequency f2 may be set by adjusting the length (electrical length) of the parasitic element 140.

In addition, the parasitic element 140 may not have the portions located on the tip side of the parasitic element 140 with respect to the folded portion 143. In this case, it is sufficient if the folded portion 143 includes the tip of the parasitic element 140, and the tip is located on the positive side of the X axis with respect to the open end 116C. Alternatively, the parasitic element 140 may not have the portion located on the tip side of the parasitic element 140 with respect to the folded portion 144. In this case, it is sufficient if the folded portion 144 includes the tip of the parasitic element 140, and the tip is located on the positive side of the X axis with respect to the open end 116C.

In addition, the parasitic element 130 may not have the portions located on the tip side of the parasitic element 130 with respect to the folded portion 133. In this case, it is sufficient if an open end is located at the position of the folded portion 133 and near the folded portion 142, and the parasitic element 140 receives power via the parasitic element 130 that does not have the portions located on the tip side of the parasitic element 130 with respect to the folded portion 133.

In addition, the width of the line between the folded portion 133 and the open end 134 may be larger than the width of the line extending from the end portion 131 through the folded portion 132 to the folded portion 133. With this configuration, the band including the communication frequency f3 may be increased.

In addition, the branch element 116 may be branched from a portion located between the grounded end 111 and the folded portion 112.

In addition, the radiation element 120 may not have the portion located on the tip side of the radiation element 120 with respect to the folded portion 123.

The embodiment describes the case where the radiation element 110 of the antenna device 100 includes the branch element 116. The radiation element 110, however, may not include the branch element 116. In this case, since the communication frequency f5 is not used, the antenna device 100 enables communication to be executed in the four communication bands (f1 to f4). In addition, if the radiation element 110 does not include the branch element 116, the parasitic element 140 may be modified as illustrated in FIGS. 9A, 9B, and 9C.

Figure 9A:
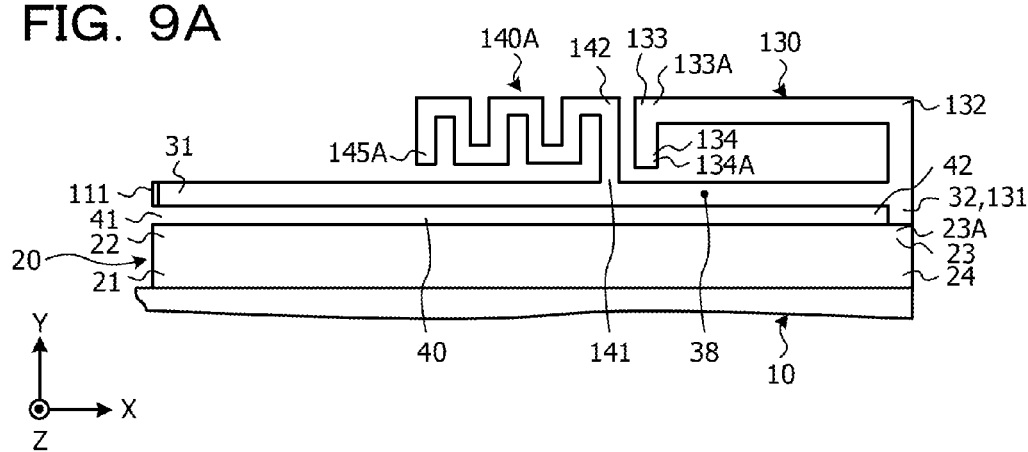
FIGS. 9A, 9B, and 9C are diagrams illustrating modified examples.
Figure 9B:
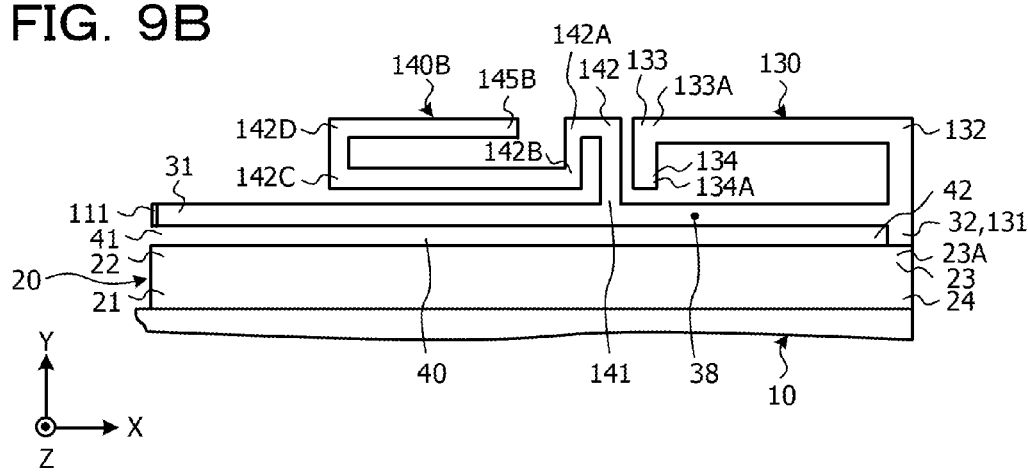
Figure 9C:
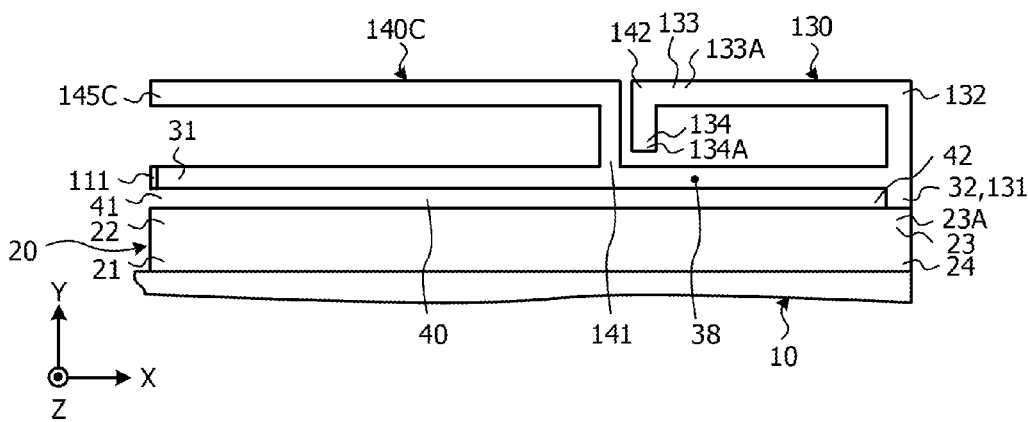

FIGS. 9A, 9B, and 9C are diagrams illustrating modified examples. Like a parasitic element 140A illustrated in FIG. 9A, the parasitic element may extend from the end portion 141 to the folded portion 142 in the positive direction on the Y axis and extend from the folded portion 142 to an open end 145A in the negative direction on the X axis in a meander manner.

In addition, like a parasitic element 140B illustrated in FIG. 9B, the parasitic element may extend from the end portion 141 to the folded portion 142 in the positive direction on the Y axis, extend from the folded portion 142 to a folded portion 142A in the negative direction on the X axis, extend from the folded portion 142A to a folded portion 142B in the negative direction on the Y axis, extend from the folded portion 142B to a folded portion 142C in the negative direction on the X axis, extend from the folded portion 142C to a folded portion 142D in the positive direction on the Y axis, and extend from the folded portion 142D to an open end 145B in the positive direction on the X axis.

In addition, like a parasitic element 140C illustrated in FIG. 9C, the parasitic element may extend from the end portion 141 to the folded portion 142 in the positive direction on the Y axis and linearly extend from the folded portion 142 to an open end 145C in the negative direction on the X axis.

The antenna device according to the embodiment and the electronic device according to the embodiment are exemplarily described, but the techniques disclosed herein are not limited to the aforementioned embodiment and may be variously modified and changed without departing from the scope of claimed subject matter.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An antenna device comprising:
   a ground plane configured to have an end side;
   a ground element configured to have a first end and a second end coupled to the ground plane and extend along the end side so that a slit having an open end on the side of the first end is formed between the ground element and the ground plane in planar view;
   a first radiation element configured to have a first line extending upright with respect to the ground element from a grounded end located close to the first end and coupled to the ground element, a second line coupled to the first line and extend along the ground element toward the second end to an end portion opposite to the grounded end, and a feed point located at the end portion of the second line;
   a second radiation element configured to have a third line coupled to the end portion of the first radiation element and extend along the ground element toward the second end, and a fourth line coupled to the third line and extending toward a direction where the fourth line is separated from the ground plane;
   a first parasitic element configured to have a first parasitic line extending from the second end toward a direction where the first parasitic line is separated from the ground plane in planar view, and a second parasitic line coupled to the first parasitic line and extending along the ground element toward the first end; and
   a second parasitic element configured to have a fifth line located close to a tip of the second parasitic line and extending from a portion between the first end and the second end toward a direction where the fifth line is separated from the ground plane, and a sixth line extending along the ground element from a tip of the fifth line toward the first end,
   wherein a length from the feed point through the first radiation element, the grounded end, the second end, and the end side to the open end of the slit is equal to a half of a wavelength corresponding to a first communication frequency,
   wherein the total length of the fifth line and the sixth line is equal to one fourth of a wavelength corresponding to a second communication frequency,
   wherein the total of a length from an end portion of the fourth line of the second radiation element to the feed point and a length from a ground potential point located on the ground element and corresponding to the feed point to an end portion of the second parasitic line of the first parasitic element is equal to a half of a wavelength corresponding to a third communication frequency higher than the first communication frequency, and wherein the total length of the third and fourth lines of the second radiation element is equal to one fourth of a wavelength corresponding to a fourth communication frequency higher than the third communication frequency.

2. The antenna device according to claim 1,
wherein the first parasitic element further has a third parasitic line extending from the tip of the second parasitic line toward the ground element, and
wherein the fifth line of the second parasitic element extends along the third parasitic line while being located close to the third parasitic line in a direction in which the ground element extends.

3. The antenna device according to claim 2,
wherein a coupling point at which the fifth line is coupled to the ground element is located close to a tip of the third parasitic line.

4. The antenna device according to claim 1,
wherein the first radiation element further has a branch element branched from the first line or the second line and extending along the second line on the opposite side to the ground plane with respect to the second line in planar view,
wherein the length of the branch element is equal to one fourth of a wavelength corresponding to a fifth communication frequency higher than the fourth communication frequency, and
wherein the tip of the second parasitic element is located on the side of the feed point with respect to a tip of the branch element in a direction in which the ground element extends.

5. The antenna device according to claim 4,
wherein the second parasitic element further has a seventh line extending from a tip of the sixth line toward the ground element, and an eighth line extending along the ground element from a tip of the seventh line toward the second end, and
wherein a tip of the eighth line is located on the side of the feed point with respect to the tip of the branch element in the direction in which the ground element extends.

6. The antenna device according to claim 1,
wherein the second communication frequency is between the first communication frequency and the third communication frequency.

7. The antenna device according to claim 1,
wherein the second radiation element has an extension line located on the side of a tip of the fourth line and folded and extending toward the first end from a direction in which the second radiation element is separated from the ground plane,
wherein the total of a length from an end portion of the extension line of the second radiation element to the feed point and the length from the ground potential point located on the ground element and corresponding to the feed point to the end portion of the second parasitic line of the first parasitic element is equal to a half of a wavelength corresponding to the third communication frequency higher than the first communication frequency, and
wherein the total length of the third line of the second radiation element and the fourth line including the extension line is equal to one fourth of a wavelength corresponding to the fourth communication frequency.

8. The antenna device according to claim 1,
wherein the first parasitic element further has a parasitic extension line located on the side of the tip of the second parasitic line and folded from the side of the first end toward the ground element and extending toward the ground element,
wherein the total of the length from the end portion of the fourth line of the second radiation element to the feed point and a length from the ground potential point to an end portion of the parasitic extension line of the first parasitic element is equal to a half of a wavelength corresponding to the third communication frequency higher than the first communication frequency, and
wherein the width of the parasitic extension line is larger than the width of a line included in the second parasitic line and located on a front side with respect to the parasitic extension line.

9. The antenna device according to claim 1,
wherein the height of the first radiation element with respect to the ground element is equal to the height of the second radiation element with respect to the ground element.

10. An electronic device comprising:
an enclosure; and
an antenna device being arranged in the enclosure, including:
a ground plane configured to have an end side;
a ground element configured to have a first end and a second end coupled to the ground plane and extend along the end side so that a slit having an open end on the side of the first end is formed between the ground element and the ground plane in planar view;
a first radiation element configured to have a first line extending upright with respect to the ground element from a grounded end located close to the first end and coupled to the ground element, a second line coupled to the first line and extend along the ground element toward the second end to an end portion opposite to the grounded end, and a feed point located at the end portion of the second line;
a second radiation element configured to have a third line coupled to the end portion of the first radiation element and extend along the ground element toward the second end, and a fourth line coupled to the third line and extending toward a direction where the fourth line is separated from the ground plane;
a first parasitic element configured to have a first parasitic line extending from the second end toward a direction where the first parasitic line is separated from the ground plane in planar view, and a second parasitic line coupled to the first parasitic line and extending along the ground element toward the first end; and
a second parasitic element configured to have a fifth line located close to a tip of the second parasitic line and extending from a portion between the first end and the second end toward a direction where the fifth line is separated from the ground plane, and a sixth line extending along the ground element from a tip of the fifth line toward the first end,
wherein a length from the feed point through the first radiation element, the grounded end, the second end, and the end side to the open end of the slit is equal to a half of a wavelength corresponding to a first communication frequency,
wherein the total length of the fifth line and the sixth line is equal to one fourth of a wavelength corresponding to a second communication frequency,
wherein the total of a length from an end portion of the fourth line of the second radiation element to the feed point and a length from a ground potential point located on the ground element and corresponding to the feed point to an end portion of the second parasitic line of the first parasitic element is equal to a half of a wavelength corresponding to a third communication frequency higher than the first communication frequency, and wherein the total length of the third and fourth lines of the second radiation element is equal to one fourth of a wavelength corresponding to a fourth communication frequency higher than the third communication frequency.

* * * * *